US009465052B2

(12) United States Patent
Wallace

(10) Patent No.: US 9,465,052 B2
(45) Date of Patent: Oct. 11, 2016

(54) SYSTEMS AND METHODS FOR MONITORING FIBER OPTIC CURRENT SENSING SYSTEMS

(71) Applicant: General Electric Company, Schenectady, NY (US)

(72) Inventor: Daniel Robert Wallace, Fulton, NY (US)

(73) Assignee: General Electric Company, Schenectady, NY (US)

( * ) Notice: Subject to any disclaimer, the term of this patent is extended or adjusted under 35 U.S.C. 154(b) by 490 days.

(21) Appl. No.: 13/913,832

(22) Filed: Jun. 10, 2013

(65) Prior Publication Data
US 2014/0361762 A1 Dec. 11, 2014

(51) Int. Cl.
*G01R 31/00* (2006.01)
*G01R 15/24* (2006.01)
*G01R 35/00* (2006.01)
*G01R 31/28* (2006.01)

(52) U.S. Cl.
CPC ......... *G01R 15/246* (2013.01); *G01R 31/2829* (2013.01); *G01R 35/00* (2013.01)

(58) Field of Classification Search
CPC ... G01R 15/246; G01R 35/00; G01R 31/2829; G01R 31/2822; G01R 33/323; G01N 22/00; G01N 2203/0641; G01N 24/008; H05H 1/46; Y10S 427/104
See application file for complete search history.

(56) References Cited

U.S. PATENT DOCUMENTS

| 4,330,808 | A | * | 5/1982 | Sawada | G01R 31/343 340/628 |
| 4,558,310 | A | * | 12/1985 | McAllise | G01R 15/18 324/127 |
| 5,134,362 | A | | 7/1992 | Ochi | |
| 5,656,934 | A | * | 8/1997 | Bosselmann | G01R 15/246 324/117 R |
| 6,434,285 | B1 | | 8/2002 | Blake et al. | |
| 6,504,355 | B2 | | 1/2003 | Minier | |
| 6,636,321 | B2 | | 10/2003 | Bohnert | |
| 6,670,799 | B1 | | 12/2003 | Bull et al. | |
| 7,233,746 | B2 | | 6/2007 | Blake et al. | |
| 7,493,052 | B2 | | 2/2009 | Blake et al. | |

(Continued)

FOREIGN PATENT DOCUMENTS

EP    1857824 A1    11/2007

OTHER PUBLICATIONS

Sawa et al. "Development of Optical Instrument Transformers", IEEE Transactions on Power Delivery, Apr. 1990, pp. 884-891, vol. 5, No. 2.

(Continued)

*Primary Examiner* — Tung X Nguyen
(74) *Attorney, Agent, or Firm* — Armstrong Teasdale LLP

(57) ABSTRACT

A system is provided. The system includes a fiber optic current sensor, and a fiber optic current transducer optically coupled to the fiber optic current sensor and configured to receive polarized light from the fiber optic current sensor, generate an electrical signal from the polarized light, and isolate a direct current (DC) component of the electrical signal. The system further includes a monitoring circuit communicatively coupled to the fiber optic current transducer and configured to receive the DC component from the fiber optic current transducer, and generate an output signal based on the DC component, wherein the output signal is indicative of an operational state of the fiber optic current sensor and the fiber optic current transducer.

20 Claims, 3 Drawing Sheets

(56) References Cited

U.S. PATENT DOCUMENTS

| | | |
|---|---|---|
| 7,655,900 B2 | 2/2010 | Kurosawa et al. |
| 7,786,719 B2 | 8/2010 | Kurosawa et al. |
| 7,911,196 B2 | 3/2011 | Bohnert |
| 8,242,402 B2 | 8/2012 | Bohnert et al. |
| 8,395,372 B2 | 3/2013 | Harlev et al. |
| 8,781,266 B2 | 7/2014 | Lee et al. |
| 2002/0011831 A1 | 1/2002 | Minier |
| 2010/0194379 A1 | 8/2010 | Kurosawa |
| 2010/0253320 A1 | 10/2010 | Kurosawa |

OTHER PUBLICATIONS

European Search Report and Opinion from corresponding EP Application No. 14171301.6 dated Nov. 6, 2014.

Kurosawa et al., "Development of Optical Fiber Current Sensors and Their Applications", IEEE/PES Transmission and Distribution Conference & Exhibition: Asia and Pacific, 2005, pp. 1-6, Dalian, China.

\* cited by examiner

SYSTEMS AND METHODS FOR MONITORING FIBER OPTIC CURRENT SENSING SYSTEMS

BACKGROUND

The field of the invention relates generally to fiber optic current sensing systems and more particularly, to monitoring operation of components in such systems.

Fiber optic current transducers (FOCT) measure current based on the Faraday effect. Due to the Faraday effect, the interaction of light with a medium in a magnetic field causes a rotation of the plane of polarization of the light by an angle that is linearly proportional to a component of the magnetic field in a direction of propagation of the light.

At least some known FOCT systems support a flint glass fiber that surrounds a conductor. Light is circulated through the flint glass fiber, and the polarization of the circulated light is measured to determine the magnitude of the current flowing through the conductor. Over time, however, components of at least some known FOCT systems may become degraded and/or damaged. For example, a light source that provides the light to be circulated may lose power over time, decreasing a reliability of the system. Further, optical connections between components may be damaged or inadvertently disconnected.

BRIEF DESCRIPTION

In one aspect, a system is provided. The system includes a fiber optic current sensor, and a fiber optic current transducer optically coupled to the fiber optic current sensor and configured to receive polarized light from the fiber optic current sensor, generate an electrical signal from the polarized light, and isolate a direct current (DC) component of the electrical signal. The system further includes a monitoring circuit communicatively coupled to the fiber optic current transducer and configured to receive the DC component from the fiber optic current transducer, and generate an output signal based on the DC component, wherein the output signal is indicative of an operational state of the fiber optic current sensor and the fiber optic current transducer.

In another aspect, a monitoring circuit communicatively coupled to a fiber optic current transducer is provided. The monitoring circuit is configured to receive a DC signal from the fiber optic current transducer, wherein the DC signal is a DC component of an electrical signal generated based on polarized light received from a fiber optic current sensor, and generate an output signal based on the DC signal, wherein the output signal is indicative of an operational state of the fiber optic current sensor and the fiber optic current transducer.

In yet another aspect, a method for monitoring operation of a fiber optic current transducer and a fiber optic current sensor is provided. The method includes receiving, at the fiber optic current transducer, polarized light from the fiber optic current sensor, generating, using a photo diode, an electrical signal from the polarized light, isolating a direct current (DC) component of the electrical signal, receiving, at a monitoring circuit, the DC component, and generating, using the monitoring circuit, an output signal based on the DC component, wherein the output signal is indicative of an operational state of the fiber optic current sensor and the fiber optic current transducer.

DETAILED DESCRIPTION

Exemplary embodiments for monitoring operation of components of a fiber optic current sensing system are described herein. A monitoring circuit receives a DC signal from a fiber optic current transducer. The DC signal is a DC component of an electrical signal generated from polarized light received from a fiber optic current sensor. Based on the DC signal, the monitoring circuit generates an output signal indicative of an operational station of the fiber optic current transducer and the fiber optic current sensor.

Figure 1:
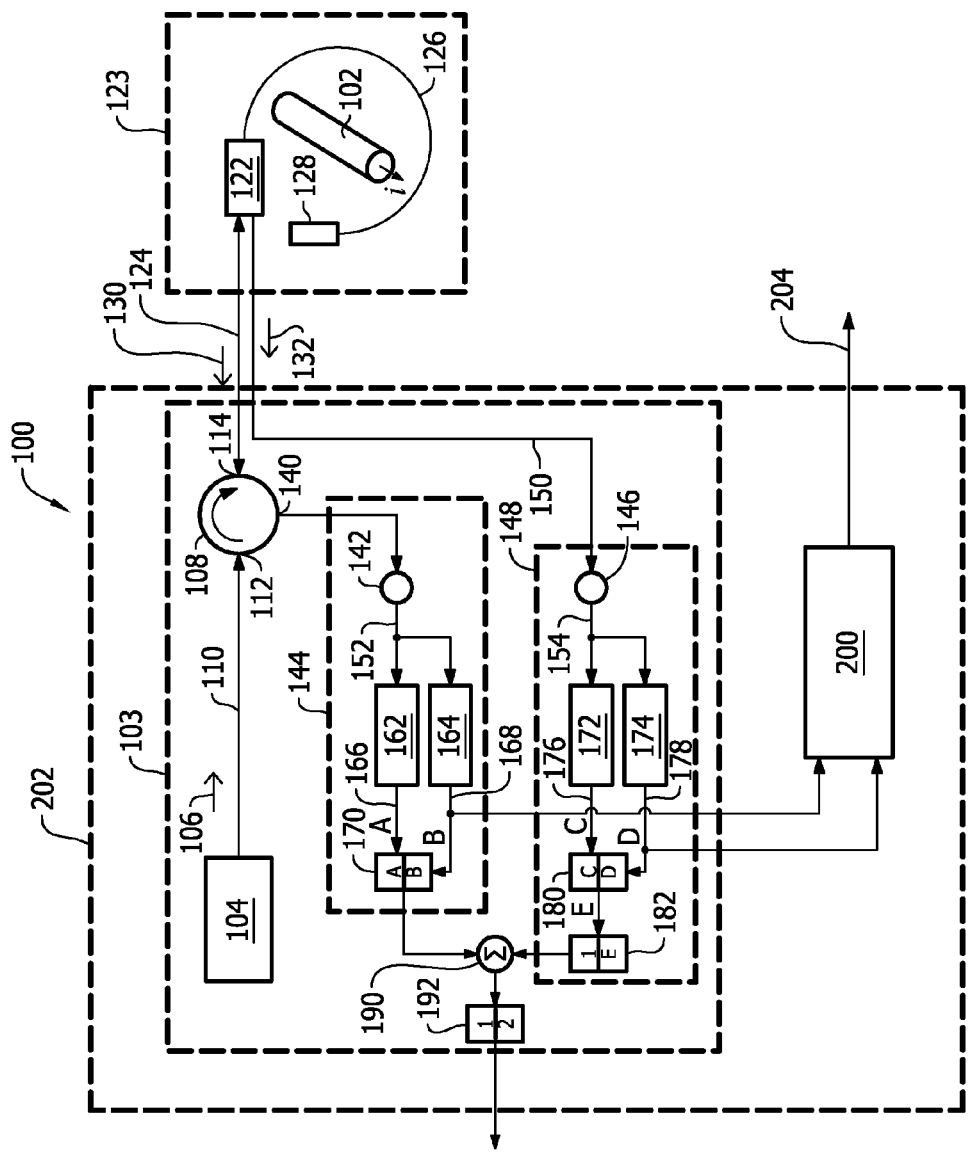
FIG. 1 is a schematic diagram of an exemplary fiber optic current sensing system.

FIG. 1 is a schematic diagram of an exemplary fiber optic current sensing system 100 for measuring a current, i, flowing through a conductor 102. System 100 includes a fiber optic current transducer (FOCT) 103 having a light source 104 that outputs a light signal 106 to an optical circulator 108 along an optical fiber 110. In the exemplary embodiment, light signal 106 is non-polarized laser light having a wavelength of approximately 1550 nanometers. Alternatively, light signal 106 may be any form of light that enables system 100 to function as described herein.

Optical circulator 108 is a three-port circulator that allows light entering one port to exit from another port in the exemplary embodiment. Specifically, light signal 106 enters optical circulator 108 at a first port 112, and exits optical circulator 108 at a second port 114.

The light exiting second port 114 is supplied to an optical box 122 of a fiber optic current sensor 123 via a bi-directional optical fiber 124. The light enters optical box 122, is transmitted through a flint glass fiber 126, reflects off a reflective surface 128 (e.g., a mirror), and returns to optical box 122 via flint glass fiber 126. When a current flows through conductor 102, which is surrounded by flint glass fiber 126, a polarization angle of the light is rotated by an amount proportional to a magnitude of the current passing through conductor 102 (i.e., the Faraday effect). Optical box 122 then outputs the rotated light as two different polarizations, x-polarization light 130 and y-polarization light 132. The polarization of y-polarization light 132 is offset 90° with respect to x-polarization light 130. If no current flows through conductor 102, a magnitude of x-polarization light 130 is equal to a magnitude of y-polarization light. If current flows through conductor 102, the polarizations will be unequal.

X-polarization light 130 travels along bi-directional optical fiber 124 and enters optical circulator 108 at second port 114. X-polarization light 130 exits optical circulator 108 at a third port 140 and is supplied to a first photo diode 142 of an x-polarization processing circuit 144. Y-polarization light 132 is supplied to a second photo diode 146 of a y-polarization processing circuit 148 via an optical fiber 150. First and second photo diodes 142 and 146 convert the x-polarization light 130 and y-polarization light 132 into associated first and second electrical signals 152 and 154.

In x-polarization processing circuit 144, first electrical signal 152 generated by first photo diode 142 is split and passed through a first high pass filter 162 and a first low pass filter 164. First high pass filter 162 isolates a first alternating current (AC) component 166 of first electrical signal 152, and first low pass filter 164 isolates a first direct current (DC)

component 168 of first electrical signal 152. A first division circuit 170 divides first AC component 166 by first DC component 168.

Similarly, in y-polarization processing circuit 148, second electrical signal 154 generated by second photo diode 146 is split and passed through a second high pass filter 172 and a second low pass filter 174. Second high pass filter 172 isolates a second AC component 176 of second electrical signal 154, and second low pass filter 174 isolates a second DC component 178 of second electrical signal 154. A second division circuit 180 divides second AC component 176 by second DC component 178. As y-polarization light 132 is 180° out of phase of x-polarization light 130, y-polarization processing circuit 148 further includes a reciprocal circuit 182 that takes the reciprocal of the output of second division circuit 180. First DC component 168 and second DC component 178 are indicative of the power or intensity of light source 104 in units of watts. For example, during normal operation of system 100, the power of light source 104 may be approximately 100 microwatts.

A summer circuit 190 receives and sums outputs from first division circuit 170 and reciprocal circuit 182, and a halving circuit 192 multiplies an output of summer circuit 190 by one half The signal output by halving circuit 192 is indicative of the current flowing through conductor 102 and may be provided to a protection system (not shown), such as a circuit breaker.

A monitoring circuit 200 monitors an operational state of FOCT 103 and fiber optic current sensor 123, as described in detail herein. For example, over time, the power of light source 104 may decay, causing light signal 106 to become unreliable. Further, fiber optic current sensor 123 may become damaged, impairing the ability to detect current through conductor 102.

In the exemplary embodiment, monitoring circuit 200 is included with FOCT 103 within a FOCT receiver 202. Alternatively, monitoring circuit 200 may be separate from FOCT receiver 202. Monitoring circuit 200 monitors at least one of first DC component 168 and second DC component 178 and generates an output signal 204 in response.

By monitoring first DC component 168, it can be determined whether fiber optic current sensor 123 and FOCT 103 are operating properly to generate x-polarization light 130. More specifically, if x-polarization light 130 is entering x-polarization processing circuit 144, first DC component 168 will have a predetermined magnitude. In the exemplary embodiment, when system 100 is operating properly, first DC component 168 may have a voltage in a range of approximately 3.6 Volts to 6.75 Volts, corresponding to a light source power in a range of approximately 80 microwatts to 150 microwatts. However, these values are merely exemplary. For example, the power of light source 104 may be increased to provide better resolution. For x-polarization light 130 to enter x-polarization processing circuit 144, light source 104 is powered to emit sufficient light, and light source 104, optical fiber 110, optical circulator 108, bi-directional optical fiber 124, and fiber optic current sensor 123 are optically coupled to one another properly. If first DC component 168 is substantially zero, it may be indicative of a malfunction and/or connection problem of light source 104, optical fiber 110, optical circulator 108, bi-directional optical fiber 124, or fiber optic current sensor 123.

By monitoring second DC component 178, it can be determined whether fiber optic current sensor 123 and FOCT 103 are operating properly to generate y-polarization light 132. More specifically, if y-polarization light 132 is entering y-polarization processing circuit 148, second DC component 178 will have a predetermined magnitude. Similar to first DC component 168, when system 100 is operating properly, second DC component 178 may have a voltage in a range of approximately 3.6 Volts to 6.75 Volts. For y-polarization light 132 to enter y-polarization processing circuit 148, light source 104 is powered to emit sufficient light, and light source 104, optical fiber 110, optical circulator 108, bi-directional optical fiber 124, fiber optic current sensor 123, and optical fiber 150 are optically coupled to one another properly. If second DC component 178 is substantially zero, it may be indicative of a malfunction and/or connection problem of light source 104, optical fiber 110, optical circulator 108, bi-directional optical fiber 124, fiber optic current sensor 123, or optical fiber 150.

Notably, by monitoring first DC component 168, it cannot be determined whether fiber optic current sensor 123 and FOCT 103 are operating properly to generate y-polarization light 132. However, by monitoring second DC component 178 it can be determined whether fiber optic current sensor 123 and FOCT 103 are operating properly to generate both x-polarization light 130 and y-polarization light 132. Accordingly, in the exemplary embodiment, monitoring circuit 200 monitors second DC component 178. In some embodiments, however, monitoring circuit 200 may additionally or alternatively monitor first DC component 168.

For clarity, only one channel of system 100 is shown in FIG. 1. In the exemplary embodiment, system 100 includes ten channels, and each channel includes an FOCT 103, a fiber optic current sensor 123, and a monitoring circuit 200. Each channel may include its own light source 104, or alternatively, the output of a single light source 104 may be split (e.g., using an optical splitter) to produce a separate light signal 106 for each channel.

Figure 2:
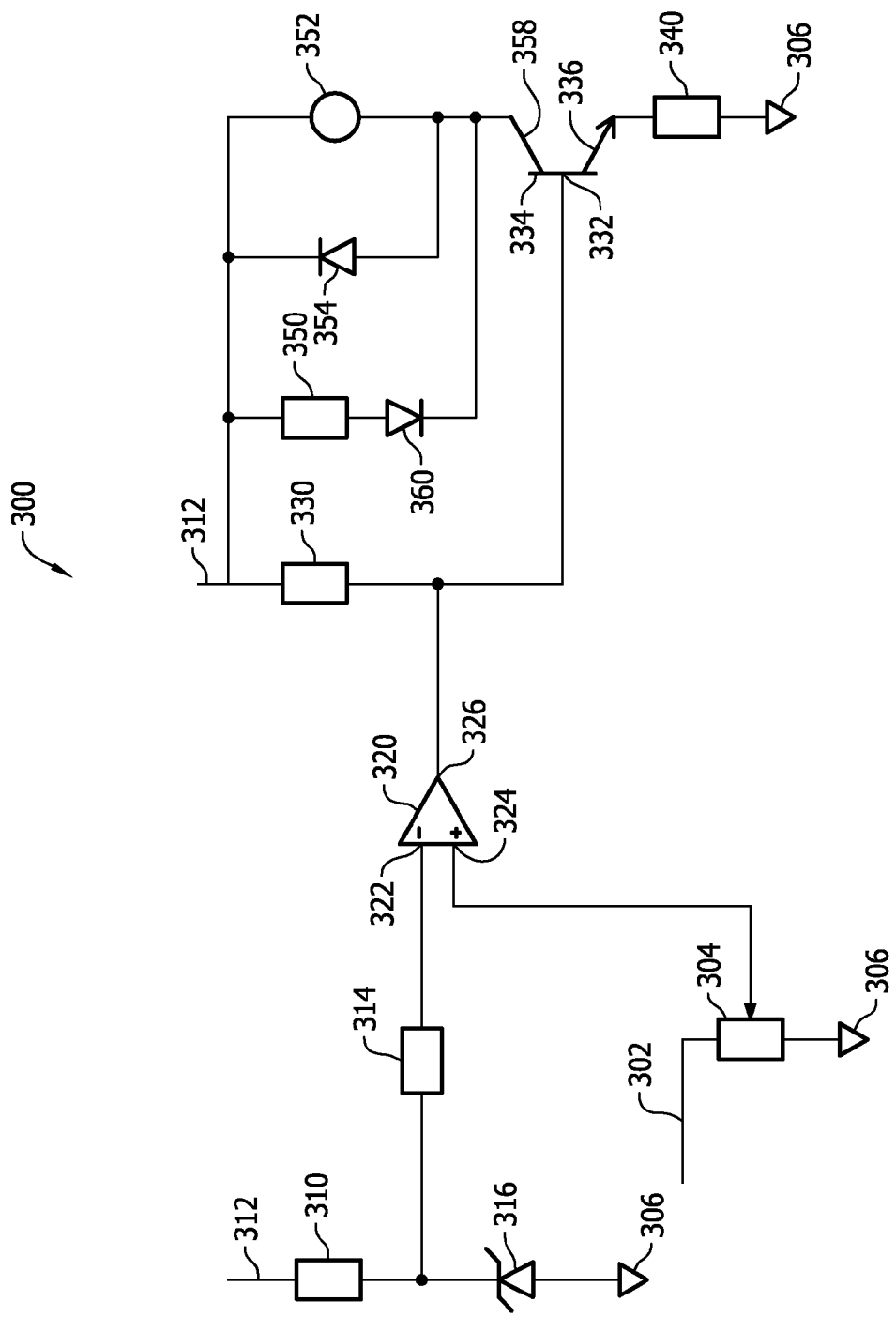
FIG. 2 is a schematic diagram of an exemplary monitoring circuit that may be used with the system shown in FIG. 1.

FIG. 2 is a schematic diagram of an exemplary monitoring circuit 300 that may be used with system 100. Monitoring circuit includes an input 302 that receives one of first DC component 168 and second DC component 178 and supplies the received input to a variable potentiometer 304 coupled to ground 306.

Monitoring circuit 300 further includes a first resistor 310 that receives a fixed power supply voltage 312. First resistor 310 is electrically coupled to a second resistor 314 and a zener diode 316 electrically coupled to ground 306. In the exemplary embodiment, fixed power supply voltage 312 is ±5 Volts, first resistor 310 has a resistance of 1 kiloohm (kΩ), second resistor 314 has a resistance of 10 kΩ, and zener diode 316 has a breakdown voltage of 3 Volts. Alternatively, fixed power supply voltage 312, first resistor 310, second resistor 314, and zener diode 316 may have any parameters that enable monitoring circuit 300 to function as described herein.

A comparator 320 includes a negative input 322 electrically coupled to second resistor 314 to receive a reference voltage and a positive input 324 electrically coupled to variable potentiometer 304. An output 326 of comparator 320 is electrically coupled to a third resistor 330 and a base 332 of a transistor 334. An emitter 336 of transistor 334 is coupled to ground 306 through a fourth resistor 340. Third resistor 330 is electrically coupled to a fifth resistor 350, a relay 352, and a protection diode 354 connected in parallel with relay 352. Third resistor 330, fifth resistor 350, relay 352, and protection diode 354 are all tied to fixed power supply voltage 312. In the exemplary embodiment, third resistor 330 has a resistance of 1.8 kΩ, fourth resistor 340 has a resistance of 6.8 Ω, and fifth resistor 350 has a resistance of 470 Ω. Alternatively, third resistor 330, fourth resistor 340, and fifth resistor 350 have any parameters that enable monitoring circuit 300 to function as described herein.

Relay 352 and protection diode 354 are electrically coupled to a collector 358 of transistor 334. Further, a light-emitting diode (LED) 360 is electrically coupled between fifth resistor 350 and collector 358. In the exemplary embodiment, LED 360 provides output signal 204 (shown in FIG. 1) by activating (i.e., illuminating) or not activating. Specifically, when first DC component 168 or second DC component 178 is non-zero (i.e., indicating proper operation of fiber optic current sensor 123 and FOCT 103), LED 360 is illuminated. When first DC component 168 or second DC component 178 is substantially zero (i.e., indicating a fault and/or malfunction of fiber optic current sensor 123 and/or FOCT 103), LED 360 is not illuminated. Accordingly, by observing LED 360, a user can quickly determine whether fiber optic current sensor 123 and FOCT 103 are operating properly. Although output signal 204 is the state of LED 360 in the exemplary embodiment, alternatively, output signal 204 may be any alert and/or notification that enables a user to determine whether fiber optic current sensor 123 and FOCT 103 are operating properly.

Notably, monitoring circuit 300 is an exemplary implementation of monitoring circuit 200 (shown in FIG. 1). Accordingly, monitoring circuit 200 is not limited to the configuration of monitoring circuit 300, but may include any components and/or design that enables monitoring operation of fiber optic current sensor 123 and FOCT 103 as described herein. For example, in some embodiments, monitoring circuit 200 may include a hysteresis circuit. If the monitored DC component varies from the predetermined magnitude only slightly or for only an instant, without a hysteresis circuit, output signal 204 may only change for an instant, which may make it difficult for a user to observe the change. However, if a hysteresis circuit is included, output signal 204 will change for a longer period of time, making it easier for a user to determine whether fiber optic current sensor 123 and FOCT 103 are operating properly.

Figure 3:
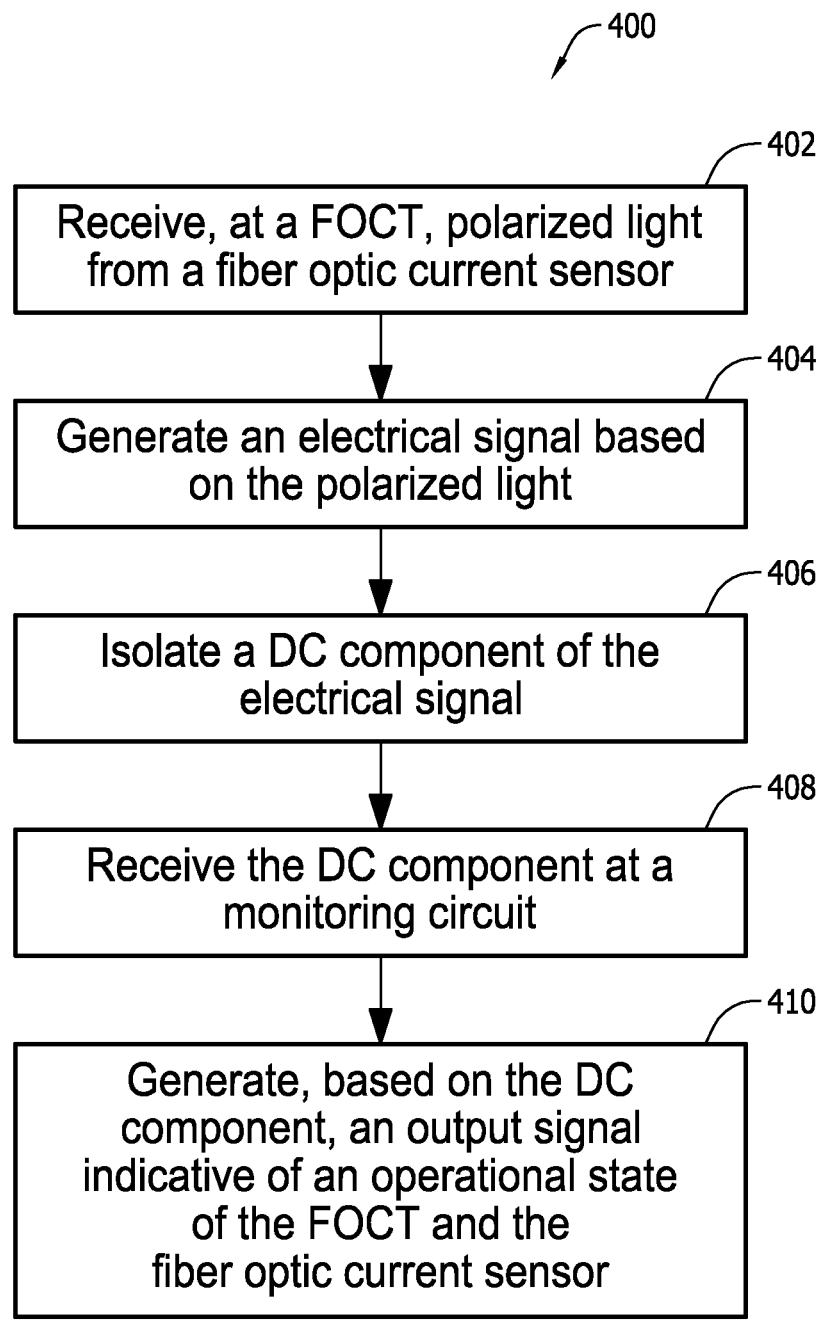
FIG. 3 is a flowchart of an exemplary method for monitoring operation of a fiber optic current transducer and a fiber optic current sensor

FIG. 3 is a flowchart of an exemplary method 400 for monitoring operation of a fiber optic current transducer and a fiber optic current sensor, such as FOCT 103 and fiber optic current sensor 123 (both shown in FIG. 1). The fiber optic current transducer receives 402 polarized light from the fiber optic current sensor. A photo diode, such as first photo diode 142 or second photo diode 146 (both shown in FIG. 1), generates 404 an electrical signal based on the polarized light. A direct current (DC) component of the electrical signal, such as first DC component 168 or second DC component 178 (both shown in FIG. 1) is isolated 406 using, for example, a low-pass filter.

A monitoring circuit, such as monitoring circuit 200 (shown in FIG. 1), receives 408 the DC component. The monitoring circuit generates 410 an output signal, such as output signal 204 (shown in FIG. 1) based on the DC component. The output signal is indicative of an operational state of the fiber optic current transducer and the fiber optic current sensor. That is, the output signal indicates whether a light source is powered and whether the fiber optic current transducer and the fiber optic current sensor are optically coupled to one another properly.

Exemplary embodiments of systems and methods for monitoring a fiber optic current sensing system are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system comprising:
a fiber optic current sensor;
a fiber optic current transducer optically coupled to said fiber optic current sensor and configured to:
  receive polarized light from said fiber optic current sensor;
  generate an electrical signal from the polarized light; and
  isolate a direct current (DC) component of the electrical signal; and
a monitoring circuit communicatively coupled to said fiber optic current transducer and configured to:
  receive the DC component from said fiber optic current transducer;
  determine whether the DC component is substantially zero; and
  generate an output signal based on whether the DC component is substantially zero, wherein the output signal is indicative of an operational state of said fiber optic current sensor and said fiber optic current transducer.

2. A system in accordance with claim 1, wherein the polarized light is y-polarization light.

3. A system in accordance with claim 1, wherein the polarized light is x-polarization light.

4. A system in accordance with claim 1, wherein said monitoring circuit comprises a light-emitting diode (LED) configured to illuminate when the DC component has a predetermined magnitude.

5. A system in accordance with claim 1, wherein said monitoring circuit comprises a relay configured to close when the DC component has a predetermined magnitude.

6. A system in accordance with claim 5, further comprising a transistor configured to open and close said relay based on an output of a comparator.

7. A system in accordance with claim 1, wherein said monitoring circuit comprises a comparator configured to compare a reference voltage to an output of a potentiometer that receives the DC component.

8. A monitoring circuit communicatively coupled to a fiber optic current transducer, said monitoring circuit configured to:
   receive a DC signal from the fiber optic current transducer, wherein the DC signal is a DC component of an electrical signal generated based on polarized light received from a fiber optic current sensor;
   determine whether the DC component is substantially zero; and
   generate an output signal based on whether the DC signal is substantially zero, wherein the output signal is indicative of an operational state of the fiber optic current sensor and the fiber optic current transducer.

9. A monitoring circuit in accordance with claim 8, wherein the polarized light is y-polarization light.

10. A monitoring circuit in accordance with claim 8, wherein the polarized light is x-polarization light.

11. A monitoring circuit in accordance with claim 8, further comprising a light-emitting diode (LED) configured to illuminate when the DC signal has a predetermined magnitude.

12. A monitoring circuit in accordance with claim 8, further comprising a relay configured to close when the DC signal has a predetermined magnitude.

13. A monitoring circuit in accordance with claim 12, further comprising a transistor configured to open and close said relay.

14. A monitoring circuit in accordance with claim 8, further comprising a comparator configured to compare a reference voltage to an output of a potentiometer that receives the DC signal.

15. A method for monitoring operation of a fiber optic current transducer and a fiber optic current sensor, said method comprising:
   receiving, at the fiber optic current transducer, polarized light from the fiber optic current sensor;
   generating, using a photo diode, an electrical signal from the polarized light;
   isolating a direct current (DC) component of the electrical signal;
   receiving, at a monitoring circuit, the DC component;
   determining, using the monitoring circuit, whether the DC component is substantially zero; and
   generating, using the monitoring circuit, an output signal based on whether the DC component is substantially zero, wherein the output signal is indicative of an operational state of the fiber optic current sensor and the fiber optic current transducer.

16. A method in accordance with claim 15, wherein receiving polarized light comprises receiving x-polarization light.

17. A method in accordance with claim 15, wherein receiving polarized light comprises receiving y-polarization light.

18. A method in accordance with claim 15, wherein generating an output signal comprises illuminating a light-emitting diode when the DC component has a predetermined magnitude.

19. A method in accordance with claim 15, wherein generating an output signal comprises closing a relay when the DC component has a predetermined magnitude.

20. A method in accordance with claim 15, wherein generating an output signal comprises comparing a reference voltage to an output of a potentiometer that receives the DC component.

* * * * *